United States Patent
Suganuma et al.

(10) Patent No.: US 9,954,339 B2
(45) Date of Patent: Apr. 24, 2018

(54) LASER UNIT AND EXTREME ULTRAVIOLET LIGHT GENERATING SYSTEM

(71) Applicant: GIGAPHOTON INC., Tochigi (JP)

(72) Inventors: Takashi Suganuma, Tochigi (JP); Hakaru Mizoguchi, Tochigi (JP); Osamu Wakabayashi, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/040,645

(22) Filed: Feb. 10, 2016

(65) Prior Publication Data
US 2016/0172814 A1    Jun. 16, 2016

Related U.S. Application Data

(63) Continuation of application No. PCT/JP2013/076270, filed on Sep. 27, 2013.

(51) Int. Cl.
*H01S 3/00* (2006.01)
*H05G 2/00* (2006.01)
(Continued)

(52) U.S. Cl.
CPC ............ *H01S 3/005* (2013.01); *G02B 27/286* (2013.01); *G03F 7/70033* (2013.01);
(Continued)

(58) Field of Classification Search
CPC ........ H01S 3/005; H01S 3/08054; H01S 3/10; H01S 3/10007; H01S 3/10023; H01S 3/10061; H01S 3/1308; H01S 3/038
See application file for complete search history.

(56) References Cited

U.S. PATENT DOCUMENTS 9,036,251 B2 * 5/2015 Nowak ............ H05G 2/008
359/333
2004/0202220 A1 * 10/2004 Hua .............. H01S 3/225
372/57
(Continued)

FOREIGN PATENT DOCUMENTS

JP    H02-237087 A    9/1990
JP    H04-200886 A    7/1992
(Continued)

OTHER PUBLICATIONS

International Search Report of PCT/JP2013/076270 dated Mar. 18, 2014.
(Continued)

*Primary Examiner* — Eric L Bolda
(74) *Attorney, Agent, or Firm* — Studebaker & Brackett PC

(57) ABSTRACT

There is provided a laser unit that may include: a master oscillator configured to output a linear-polarized laser light beam; a first polarization device disposed in a light path of the linear-polarized laser light beam and provided with a polarization axis substantially aligned with a polarization direction of the linearly-polarized incident laser light beam; a second polarization device disposed in the light path of the linear-polarized laser light beam and provided with a polarization axis substantially aligned with a direction of the polarization axis of the first polarization device; and a laser amplifier disposed between the first polarization device and the second polarization device in the light path of the linear-polarized laser light beam and including a pair of discharge electrodes disposed to oppose each other, an opposing direction of the pair of discharge electrodes being substantially aligned with the direction of the polarization axis of the first polarization device.

7 Claims, 17 Drawing Sheets

(51) Int. Cl.
*G02B 27/28* (2006.01)
*H01S 3/23* (2006.01)
*H01S 3/038* (2006.01)
*G03F 7/20* (2006.01)

(52) U.S. Cl.
CPC .......... *G03F 7/70041* (2013.01); *H01S 3/038* (2013.01); *H01S 3/2316* (2013.01); *H05G 2/008* (2013.01)

(56) References Cited

U.S. PATENT DOCUMENTS

| | | | | |
|---|---|---|---|---|
| 2007/0230527 | A1* | 10/2007 | Sakai | H01S 5/141 372/43.01 |
| 2007/0291350 | A1* | 12/2007 | Ershov | H05G 2/008 359/333 |
| 2008/0069157 | A1* | 3/2008 | Ariga | H01S 3/2308 372/21 |
| 2011/0058588 | A1 | 3/2011 | Ershov et al. | |
| 2013/0034116 | A1* | 2/2013 | Nowak | H05G 2/008 372/27 |

FOREIGN PATENT DOCUMENTS

| | | |
|---|---|---|
| JP | H04-369881 A | 12/1992 |
| JP | H10-112570 A | 4/1998 |
| JP | 2006-165484 A | 6/2006 |
| JP | 2008-085292 A | 4/2008 |
| JP | 2008-283107 A | 11/2008 |
| JP | 2010-118518 A | 5/2010 |
| JP | 2012-109417 A | 6/2012 |
| JP | 5086677 B2 | 11/2012 |

OTHER PUBLICATIONS

An Office Action; "Notice of Reasons for Rejection," mailed by the Japanese Patent Office dated Jul. 11, 2017, which corresponds to Japanese Patent Application No. 2015-538738 and is related to U.S. Appl. No. 15/040,645; with English Translation.

* cited by examiner

LASER UNIT AND EXTREME ULTRAVIOLET LIGHT GENERATING SYSTEM

CROSS REFERENCE TO RELATED APPLICATIONS

This is a continuation of International Application No. PCT/JP2013/076270, filed Sep. 27, 2013, the entire contents of which are incorporated herein by reference.

BACKGROUND

The disclosure relates to a laser unit and an extreme ultraviolet light generating system to generate extreme ultraviolet (EUV) light based on pulsed laser light outputted from the laser unit.

In recent years, miniaturization of a transcription pattern of an optical lithography in a semiconductor process is drastically progressing with the development in fining of the semiconductor process. In the next generation, microfabrication on the order of 70 nm to 45 nm, and further microfabrication on the order of 32 nm or less are bound to be required. To meet such requirement for the microfabrication on the order of, for example, 32 nm or less, development is anticipated of an exposure apparatus that includes a combination of a reduced projection reflective optics and an extreme ultraviolet light generating apparatus that generates extreme ultraviolet (EUV) light with a wavelength of about 13 nm. For example, reference is made Japanese Patent No. 5086677, Japanese Unexamined Patent Application Publication No. 2008-283107. U.S. Patent Application Publication No. 2011/0058588, and Japanese Unexamined Patent Application Publication No. H10-112570.

As the EUV light generating apparatus, three kinds of apparatuses, laser produced plasma (LPP) apparatus using plasma generated by application of a laser beam to a target substance, a discharge produced plasma (DPP) apparatus using plasma generated by discharge, and a synchrotron radiation (SR) apparatus using orbital radiation light have been proposed.

SUMMARY

A laser unit according to an embodiment (1) of the disclosure may include: a master oscillator configured to output a linear-polarized laser light beam; a first polarization device disposed in a light path of the linear-polarized laser light beam from the master oscillator and provided with a polarization axis that is substantially aligned with a polarization direction of the linearly-polarized incident laser light beam; a second polarization device disposed in the light path of the linear-polarized laser light beam and provided with a polarization axis that is substantially aligned with a direction of the polarization axis of the first polarization device: and a laser amplifier disposed between the first polarization device and the second polarization device in the light path of the linear-polarized laser light beam and including a pair of discharge electrodes disposed to oppose each other, an opposing direction of the pair of discharge electrodes being substantially aligned with the direction of the polarization axis of the first polarization device.

A laser unit according to an embodiment (2) of the disclosure may include: a master oscillator configured to output a laser light beam; and a plurality of laser amplifiers disposed in a light path of the laser light beam from the master oscillator and each including a pair of discharge electrodes disposed to oppose each other, an opposing direction of the pair of discharge electrodes in one of the plurality of laser amplifiers being different from an opposing direction of the pair of discharge electrodes in another one of the plurality of laser amplifiers.

A laser unit according to an embodiment (3) of the disclosure may include: a master oscillator configured to output a laser light beam, a plurality of laser amplifiers disposed in a light path of the laser light beam from the master oscillator and each including a pair of discharge electrodes disposed to oppose each other; and one or more image rotators each disposed between adjacent two laser amplifiers of the plurality of laser amplifiers.

A laser unit according to an embodiment (4) of the disclosure may be configured to supply a pulsed laser light beam into an extreme ultraviolet light generating system, the extreme ultraviolet light generating system being configured to apply, in a plasma chamber, the pulsed laser light beam to a target to generate extreme ultraviolet light, the laser unit including: a master oscillator configured to output a laser light beam as a seed of the pulsed laser light beam; and a laser amplifier disposed in a light path of the laser light beam from the master oscillator and including a pair of discharge electrodes disposed to oppose each other, an opposing direction of the pair of discharge electrodes being brought into rotational alignment around an optical axis of the pulsed laser light beam to prevent a reflected light beam from being incident upon opposing surfaces of the pair of electrodes, the reflected light beam being derived from the target and having reversely-traveled, from the target, in an off-axis direction that is different from a traveling direction of the pulsed laser light beam.

An extreme ultraviolet light generating system according to an embodiment (1) of the disclosure may include: a plasma chamber in which extreme ultraviolet light is to be generated: and the laser unit according to according to the embodiment (1) of the disclosure configured to supply a pulsed laser light beam into the plasma chamber, in which the linear-polarized laser light beam from the master oscillator serves as a seed of the pulsed laser light beam.

An extreme ultraviolet light generating system according to an embodiment (2) of the disclosure may include: a plasma chamber in which extreme ultraviolet light is to be generated; and the laser unit according to the embodiment (2) of the disclosure configured to supply a pulsed laser light beam into the plasma chamber, in which the laser light beam from the master oscillator serves as a seed of the pulsed laser light beam.

An extreme ultraviolet light generating system according to an embodiment (3) of the disclosure may include: a plasma chamber in which extreme ultraviolet light is to be generated; and the laser unit according to the embodiment (3) of the disclosure configured to supply a pulsed laser light beam into the plasma chamber, in which the laser light beam from the master oscillator serves as a seed of the pulsed laser light beam.

An extreme ultraviolet light generating system according to an embodiment (4) of the disclosure may include: the laser unit according to the embodiment (4) of the disclosure configured to supply the pulsed laser light beam into the plasma chamber; the plasma chamber in which the pulsed laser light beam is to be applied to the target to generate extreme ultraviolet light; and a target supply unit configured to supply the target into the plasma chamber.

BRIEF DESCRIPTION OF THE DRAWINGS

Some example embodiments of the disclosure are described below as mere examples with reference to the accompanying drawings.

DETAILED DESCRIPTION

Figure 1:
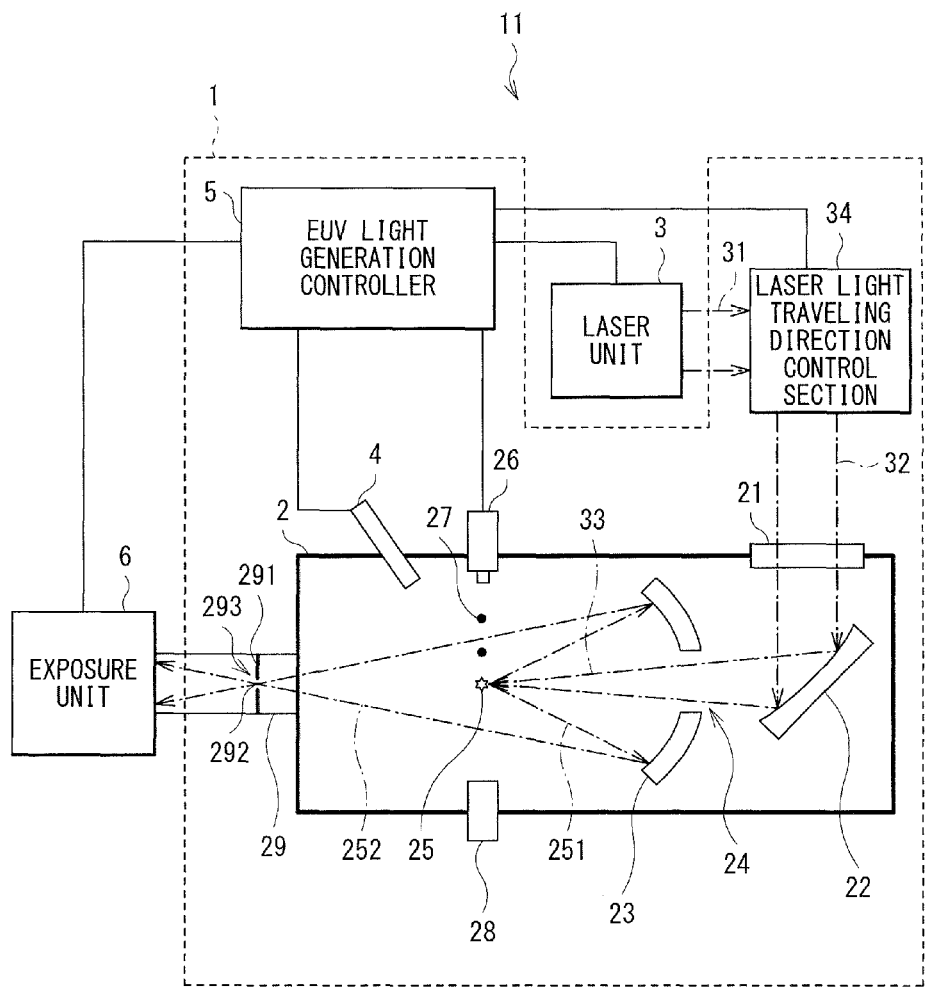
FIG. 1 schematically illustrates a configuration example of an exemplary LPP EUV light generating system.

[Contents]
[1. Outline]
[2. General Description of EUV Light Generating System]
  2.1 Configuration
  2.2 Operation
[3. Laser Unit Including Master Oscillator and Laser Amplifier]
  3.1 Configuration
  3.2 Operation
  3.3 Issues
4. First Embodiment
  4.1 Configuration
  4.2 Operation
  4.3 Action
5. Second Embodiment
  5.1 Configuration
  5.2 Operation
  5.3 Action
  5.4 Others
6. Third Embodiment
  6.1 Configuration
  6.2 Operation
  6.3 Action
  6.4 Modification Example
    6.4.1 Configuration
    6.4.2 Operation
    6.4.3 Action
7. Fourth Embodiment
[8. Variations of Laser Amplifier]
  8.1 Triaxial Orthogonal Amplifier
  8.2 Slab Amplifier
[9. Variations of Polarization Unit]
  9.1 Transmission polarizer
  9.2 Reflection polarizer
  9.3 Example of Combination of Plurality of Reflection polarizers
[10. Variations of Image Rotator]
  10.1 Image Rotator Using Dove Prism
  10.2 First Configuration Example of Image Rotator Using Three Reflection Mirrors
  10.3 Second Configuration Example of Image Rotator Using Three Reflection Mirrors
[11. Others]

Hereinafter, some embodiments of the disclosure are described in detail with reference to the drawings. The embodiments described below each illustrate one example of the disclosure and are not intended to limit the contents of the disclosure. Also, all of the configurations and operation described in each embodiment are not necessarily essential for the configurations and operation of the disclosure. Note that the like components are denoted with the same reference numerals, and any redundant description thereof is omitted.

[1. Outline]

The disclosure relates to a high-power laser unit for a laser produced plasma (LPP) extreme ultra violet (EUV) light generating apparatus.

[2. General Description of EUV Light Generating System]

2.1 Configuration

FIG. 1 schematically illustrates a configuration of an exemplary LPP EUV light generating system. An EUV light generating apparatus 1 may be used together with one or more laser units 3. In the embodiment of the present application, a system including the EUV light generating apparatus 1 and the laser unit 3 is referred to as an EUV light generating system 11. As illustrated in FIG. 1 and as described in detail below, the EUV light generating apparatus 1 may include a chamber 2 and, for example, a target feeder 26 serving as a target feeding unit. The chamber 2 may be sealable. The target feeder 26 may be so attached as to penetrate a wall of the chamber 2, for example. A material of a target substance to be fed from the target feeder 26 may be tin, terbium, gadolinium, lithium, xenon, or any combination of two or more thereof without limitation.

The wall of the chamber 2 may be provided with one or more through holes. The through hole may be provided with a window 21. Pulsed laser light 32 outputted from the laser unit 3 may pass through the window 21. An EUV light concentrating mirror 23 including a spheroidal reflection surface may be provided inside the chamber 2, for example. The EUV light concentrating mirror 23 may include a first focal point and a second focal point. A surface of the EUV light concentrating mirror 23 may be provided with a multilayer reflection film in which, for example, molybdenum and silicon are alternately stacked. For example, the EUV light concentrating mirror 23 may be preferably disposed in such a manner that the first focal point is located in a plasma generation region 25 or in the vicinity of the plasma generation region 25, and that the second focal point is located at an intermediate focus point (IF) 292. The intermediate focus point 292 may be a desired light concentration position defined by specifications of an exposure unit 6. The EUV light concentrating mirror 23 may be provided with a through hole 24 provided at a center part of the EUV light concentrating mirror 23 and through which pulsed laser light 33 may pass.

The EUV light generating apparatus 1 may include an EUV light generation controller 5. The EUV light generation controller 5 may include, for example, a target sensor 4. The target sensor 4 may detect one or more of presence, trajectory, position, and speed of a target 27. The target sensor 4 may include an image-pickup function.

The EUV light generating apparatus 1 may further include a connection section 29 that allows the inside of the chamber 2 to be in communication with the inside of the exposure unit 6. A wall 291 provided with an aperture 293 may be provided inside the connection section 29. The wall 291 may be disposed so that the aperture 293 is located at the second focal point of the EUV light concentrating mirror 23.

The EUV light generating apparatus 1 may include a laser light traveling direction control section 34, a laser light concentrating mirror 22, a target collector 28, etc. The target collector 28 may collect the target 27. The laser light traveling direction control section 34 may include, in order to control the traveling direction of the laser light, an optical device that defines a traveling direction of the laser light and an actuator that adjusts position, attitude, etc., of the optical device.

2.2 Operation

Referring to FIG. 1, pulsed laser light 31 outputted from the laser unit 3 may travel through the laser light traveling direction control section 34. The pulsed laser light 31 that has passed through the laser light traveling direction control section 34 may enter, as the pulsed laser light 32, the chamber 2 after passing through the window 21. The pulsed laser light 32 may travel inside the chamber 2 along one or more laser light paths, and then may be reflected by the laser light concentrating mirror 22. The pulsed laser light 32 reflected by the laser light concentrating mirror 22 may be applied, as the pulsed laser light 33, to one or more targets 27.

The target feeder 26 may be adapted to output the target 27 to the plasma generation region 25 inside the chamber 2. The target 27 may be irradiated with one or more pulses included in the pulsed laser light 33. The target 27 irradiated with the pulsed laser light may turn into plasma, and EUV light 251 may be radiated together with radiation light from the plasma. The EUV light 251 may be reflected and concentrated by the EUV light concentrating mirror 23. EUV light 252 reflected by the EUV light concentrating mirror 23 may travel through the intermediate focus point 292. The EUV light 252 having travelled through the intermediate focus point 292 may be outputted to the exposure unit 6. Note that a plurality of pulses included in the pulsed laser light 33 may be applied to one target 27.

The EUV light generation controller 5 may be adapted to manage a control of the EUV light generating system 11 as a whole. The EUV light generation controller 5 may be adapted to process, for example, data of an image of the target 27 picked up by the target sensor 4. For example, the EUV light generation controller 5 may be adapted to control one or both of output timing of the target 27 and an output direction of the target 27.

For example, the EUV light generation controller 5 may be adapted to control one or more of oscillation timing of the laser unit 3, the traveling direction of the pulsed laser light 32, and a concentration position of the pulsed laser light 33. The above-described various controls are illustrative, and other control may be added as necessary.

[3. Laser Unit Including Master Oscillator and Laser Amplifier]

3.1 Configuration

Figure 2:
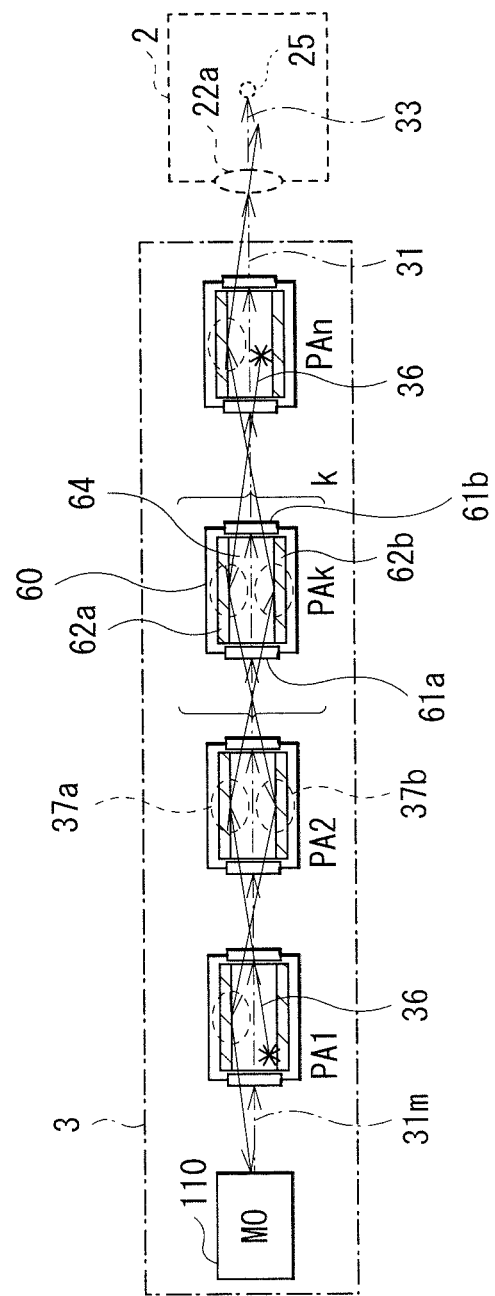
FIG. 2 schematically illustrates a configuration example of a laser unit including a master oscillator and laser amplifiers.

With reference to FIG. 2, description is given of a configuration example of the laser unit 3 used for an LPP EUV light generating apparatus. The LPP EUV light generating apparatus may include a $CO_2$ laser unit as the laser unit 3. The $CO_2$ laser unit used as the laser unit 3 may be required to output pulsed laser light of high pulse energy with high repetition frequency. The laser unit 3 may therefore include a master oscillator (MO) 110. The master oscillator 110 may output pulsed laser light 31$m$ with high repetition frequency. The laser unit 3 may be disposed in an optical path of the pulsed laser light 31$m$, and may include one or more laser amplifiers. The laser amplifier may amplify the pulsed laser light 31$m$. For example, as illustrated in FIG. 2, the laser unit 3 may include, as the laser amplifiers, a plurality of amplifiers PA1, PA2, . . . , PAk, . . . , and PAn.

The master oscillator 110 may be a laser oscillator including a Q switch, $CO_2$ laser gas as a laser medium, and an optical resonator. Alternatively, the master oscillator 110 may be a quantum cascade laser (QCL) that oscillates in an amplification wavelength band of a $CO_2$ laser.

The plurality of amplifiers PA1, PA2 . . . , PAk, . . . , and PAn may each be a laser amplifier using $CO_2$ laser gas as a laser medium. The plurality of amplifiers PA1, PA2, . . . , PAk, . . . , and PAn may each include a pair of electrodes 62$a$ and 62$b$ disposed in a laser chamber 60. The laser chamber 60 may contain $CO_2$ laser gas. The plurality of amplifiers PA1, PA2, . . . , PAk, . . . , and PAn may each include an unillustrated radio-frequency (RF) power source that applies a voltage between the pair of electrodes 62$a$ and 62$b$. The pair of electrodes 62$a$ and 62$b$ may be discharge electrodes that excite the laser medium by discharge in a discharge region 64. Each of the plurality of amplifiers PA1, PA2, . . . , PAk, . . . , and PAn may be provided with an input window 61$a$. The input window 61$a$ may allow pulsed laser light from the outside to enter the inside of the laser chamber 60. Each of the plurality of amplifiers PA1, PA2, . . . , PAk, . . . , and PAn may be provided with an output window 61$b$. The output window 61$b$ may allow amplified pulsed laser light to output to the outside of the laser chamber 60. The plurality of amplifiers PA1, PA2, . . . , PAk, . . . , and PAn may be disposed in series to one another in the optical path of pulsed laser light 31$m$ that is outputted from the master oscillator 110.

3.2 Operation

Each of the plurality of amplifiers PA1, PA2, ..., PAk, ..., and PAn may apply a voltage between the pair of electrodes 62a and 62b by its corresponding unillustrated RF power source to cause discharge. The plurality of amplifiers PA1, PA2, ..., PAk, ..., and PAn may each operate the Q switch of the master oscillator 110 with a predetermined repetition frequency. As a result, the master oscillator 110 may output the pulsed laser light 31m with the predetermined repetition frequency.

Even in a case where the pulsed laser light 31m outputted from the master oscillator 110 does not enter the plurality of amplifiers PA1, PA2, ..., PAk, ..., and PAn, the plurality of amplifiers PA1, PA2, ..., PAk, ..., and PAn may cause discharge by the unillustrated RF power sources to excite the laser medium. The pulsed laser light 31m outputted from the master oscillator 110 may enter the first amplifier PA1 as seed light and pass through the inside of the first amplifier PA1 to be subjected to amplification, following which the thus-amplified pulsed laser light may be outputted. The amplified pulsed laser light outputted from the first amplifier PA1 may enter the second amplifier PA2 as seed light and pass through the inside of the second amplifier PA2 to be subjected to further amplification, following which the thus-amplified pulsed laser light may be outputted. Similarly, pulsed laser light outputted from a k−1th amplifier PAk−1 may enter the kth amplifier PAk as seed light and pass through the inside of the kth amplifier PAk to be subjected to further amplification, following which the thus-amplified pulsed laser light may be outputted. Then, pulsed laser light outputted from an n−1th amplifier PAn−1 may enter the nth amplifier PAn as seed light and pass through the inside of the nth amplifier PAn to be subjected to further amplification, following which the thus-amplified pulsed laser light may be outputted.

The pulsed laser light 31 outputted from the nth amplifier PAn may enter the chamber 2 serving as a plasma chamber in the EUV light generating apparatus 1 illustrated in FIG. 1, and the thus-entered pulsed laser light 31 may be concentrated on the plasma generation region 25 by a laser concentrating optical system 22a. The pulsed laser light 31 concentrated on the plasma generation region 25 may be applied as the pulsed laser light 33 to a target in the plasma generation region 25. The target irradiated with the pulsed laser light 33 may turn into plasma, and EUV light may be radiated from the plasma. Note that the laser light concentrating optical system 22a may be configured of a reflective optical device or a plurality of reflective optical devices corresponding to the laser light concentrating mirror 22 illustrated in FIG. 1, or may be a refractive optical system including a lens.

3.3 Issues

The $CO_2$ laser unit including a combination of the master oscillator 110 and one or more laser amplifiers holds a possibility of causing self-oscillation by amplified spontaneous emission (ASE) light 36 outputted from the one or more laser amplifiers irrespective of the pulsed laser light 31m outputted from the master oscillator 110. When the ASE light 36 other than seed light enters any other laser amplifier, the laser amplifier the ASE light 36 has entered may hold a possibility of amplifying the ASE light 36 other than the seed light. This may decrease an amplification factor upon amplification of the seed light. Accordingly, suppression of self-oscillation by the ASE light 36 may be desired. Note that the seed light may be laser light to be amplified by a laser amplifier. For example, in FIG. 2, in the first amplifier PA1, the pulsed laser light 31m outputted from the master oscillator 110 may serve as the seed light. In the second amplifier PA2, the amplified pulsed laser light outputted from the first amplifier PA1 may serve as the seed light.

For example, the ASE light 36 generated in the nth amplifier PAn may be amplified by the amplifier PAn, and the amplified ASE light 36 may travel toward a direction where the master oscillator 110 is provided to obliquely enter surfaces of the pair of electrodes 62a and 62b of another laser amplifier. The ASE light 36 may be reflected at high reflectivity by the surfaces of the pair of electrodes 62a and 62b, as illustrated in a region 37b surrounded by a broken line in FIG. 2. The thus-reflected light may be further amplified by the plurality of amplifiers PA1, PA2, ..., PAk, ..., and PAn−1 to be turned to self-oscillation light.

Moreover, the ASE light 36 generated in the first amplifier PA1 may be amplified by the amplifier PA1, and the thus-amplified ASE light 36 may travel toward a direction where the chamber 2 is provided to obliquely enter surfaces of the pair of electrodes 62a and 62b in another laser amplifier. The ASE light 36 may be reflected at high reflectivity by the surfaces of the pair of electrodes 62a and 62b, as illustrated in a region 37a surrounded by a broken line in FIG. 2. The thus-reflected light may be further amplified by the plurality of amplifiers PA2, ..., PAk, ..., and PAn to be turned to self-oscillation light.

Thus, the ASE light 36 generated in a given laser amplifier may be reflected by the surfaces of the pair of electrodes 62a and 62b, and the thus-reflected ASE light 36 may be amplified by another laser amplifier to be turned to self-oscillation light. The ASE light 36 may decrease output of the pulsed laser light 31 outputted from the laser unit 3 and may exert an adverse effect on a pulsed waveform of the pulsed laser light 31. This may decrease output of EUV light. Moreover, in a case where self-oscillation light enters the master oscillator 110, the self-oscillation light may damage optical parts of the master oscillator 110.

4. First Embodiment

4.1 Configuration

Figure 3:
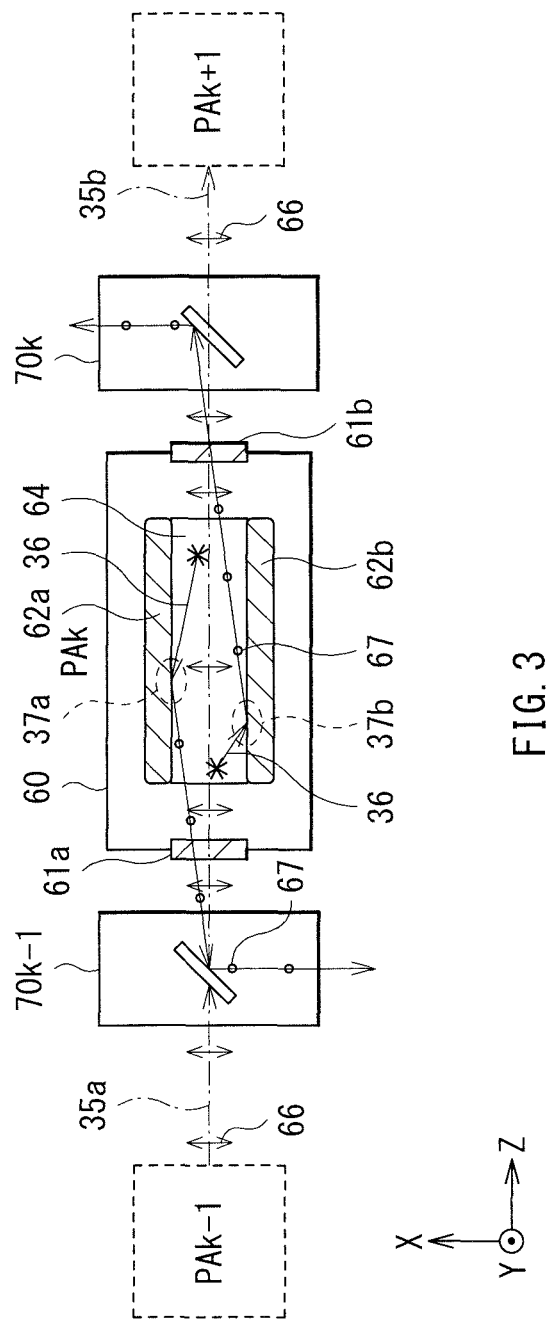
FIG. 3 schematically illustrates a configuration example viewed from a Y direction of a main part of the laser unit according to a first embodiment.
Figure 4:
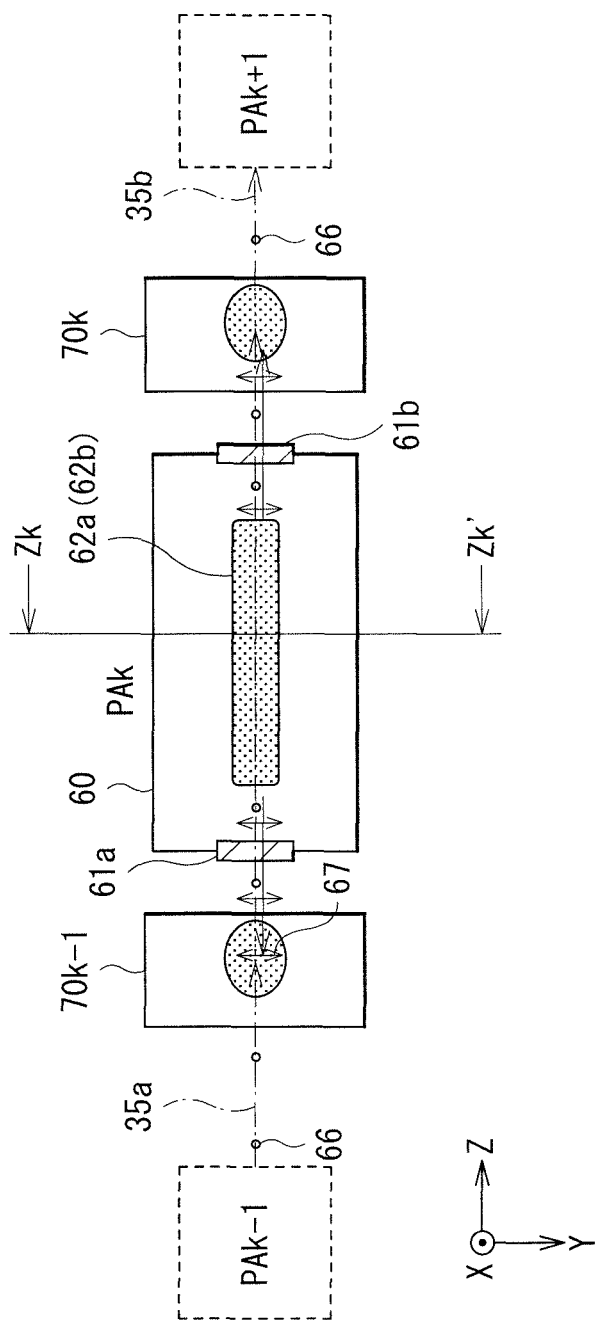
FIG. 4 schematically illustrates a configuration example viewed from an X direction of the main part of the laser unit according to the first embodiment.
Figure 5:
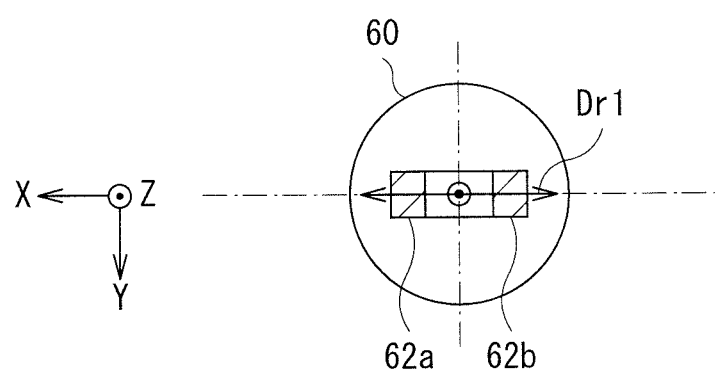
FIG. 5 schematically illustrates an example of a direction of discharge by a pair of electrodes in the laser unit according to the first embodiment.

With reference to FIGS. 3 to 5, description is given of a configuration of a laser unit according to a first embodiment of the disclosure. FIG. 3 schematically illustrates a configuration example viewed from a Y direction of a main part of the laser unit according to the first embodiment. FIG. 4 schematically illustrates a configuration example viewed from an X direction of the main part of the laser unit according to the first embodiment. FIG. 5 schematically illustrates an example of a direction of discharge Dr1 by the pair of electrodes 62a and 62b in the amplifier PAk of the laser unit according to the first embodiment. FIG. 5 is a sectional view, taken along line Zk-Zk' of FIG. 4, of the amplifier PAk illustrated in FIG. 4.

In the laser unit 3 illustrated in FIG. 2, at least one of the plurality of amplifiers PA1, PA2, ..., PAk, ..., and PAn may be disposed between two polarizing devices. For example, as illustrated in FIGS. 3 and 4, the kth amplifier PAk may be disposed between a first polarization unit 70k−1 as a first polarization device and a second polarization unit 70k as a second polarization device.

In the laser unit 3 illustrated in FIG. 2, the master oscillator 110 may output, as the pulsed laser light 31m, linear-polarized laser light of a predetermined polarized component. The k−1th amplifier PAk−1 may output, as seed light 35a, the linear-polarized laser light of the predetermined polarized component to the first polarization unit 70k−1. The predetermined polarized component may be a component 66 in an X-axis direction in FIGS. 3 to 5. A polarized component orthogonal to the predetermined polarized component may be a component 67 in a Y-axis direction in FIGS. 3 to 5.

The first polarization unit 70k–1 and the second polarization unit 70k may each include one or more polarizers. The first polarization unit 70k–1 and the second polarization unit 70k may each be provided with a polarization axis substantially aligned with a polarization direction of the seed light 35a. The first polarization unit 70k–1 and the second polarization unit 70k may each include a transmission polarizer. The transmission polarizer may allow the predetermined polarized component to pass therethrough toward a predetermined direction. Alternatively, the first polarization unit 70k–1 and the second polarization unit 70k may each include a reflection polarizer. The reflection polarizer may reflect the predetermined polarized component toward a predetermined direction.

The amplifier PAk may include, in the laser chamber 60, the pair of electrodes 62a and 62b as a pair of discharge electrodes and $CO_2$ laser gas as a laser medium. The laser chamber 60 may be provided with the input window 61a and the output window 61b. The pair of electrodes 62a and 62b may each be a plate made of a material such as aluminum (Al) or copper (Cu). The pair of electrodes 62a and 62b may be coupled to an unillustrated RF power source. In the amplifier PAk, the pair of electrodes 62a and 62b may be disposed to oppose each other so that the direction of discharge Dr1 by the pair of electrodes 62a and 62b is substantially aligned with a polarization direction of the seed light 35a as input laser light. The direction of discharge Dr1 by the pair of electrodes 62a and 62b may be the X-axis direction as illustrated in FIG. 5. The direction of discharge Dr1 by the pair of electrodes 62a and 62b may be same as an opposing direction of the pair of electrodes 62a and 62b. The pair of electrodes 62a and 62b may be disposed to oppose each other so that the opposing direction of the pair of electrodes 62a and 62b is substantially aligned with a direction of polarization axes of the first polarization unit 70k–1 and the second polarization unit 70k. A polarization direction of amplified laser light 35b outputted from the amplifier PAk may be substantially aligned with the direction of the polarization axes of the first polarization unit 70k–1 and the second polarization unit 70k.

The laser chamber 60 may be provided with the input window 61a fixed at a position that allows the seed light 35a to enter the inside of the discharge region 64 between the pair of electrodes 62a and 62b. The laser chamber 60 may be provided with the output window 61b fixed at a position that allows laser light having passed through the discharge region 64 to be amplified to be outputted to the outside.

4.2 Operation

The linear-polarized laser light outputted from the amplifier PAk–1, while maintaining its polarization state, may be inputted as the seed light 35a to the amplifier PAk via the first polarization unit 70k–1. In the amplifier PAk, the seed light 35a, while maintaining its polarization state, may pass through the inside of the discharge region 64 between the pair of electrodes 62a and 62b via the input window 61a to be subjected to amplification, following which the thus-amplified seed light 35a may be outputted as the amplified laser light 35b via the output window 61b. The amplified laser light 35b outputted from the amplifier PAk, while maintaining its polarization state, may enter the following amplifier PAk+1 via the second polarization unit 70k.

In the amplifier PAk, the ASE light 36 generated in the discharge region 64 may obliquely enter the surfaces of the pair of electrodes 62a and 62b as illustrated in the regions 37a and 37b surrounded by the broken lines in FIG. 3. In this situation, the ASE light 36 in the Y-axis direction may be reflected at high reflectivity, and reflectivity of the ASE light 36 in the X-axis direction may be decreased. As a result, a polarized component in the Y direction of self-oscillation light resulting from amplification of the ASE light 36 may be increased more than a polarized component in the X direction of the self-oscillation light. For example, a ratio of the polarized component in the X direction to the polarized component in the Y direction may be 1:40. The polarized component in the Y direction of the self-oscillation light may be removed from the optical path of the laser light by the first polarization unit 70k–1 and the second polarization unit 70k.

4.3 Action

According to the first embodiment, a component in a polarization direction orthogonal to the direction of discharge Dr1 of the ASE light 36 may be reflected at high reflectivity by the surfaces of the pair of electrodes 62a and 62b. This may easily cause self-oscillation by the ASE light 36. However, the first polarization unit 70k–1 and the second polarization unit 70k may suppress propagation of self-oscillation light in the polarization direction orthogonal to the direction of discharge Dr1 in the optical path of the laser light.

5. Second Embodiment 5.1 Configuration

Figure 6:
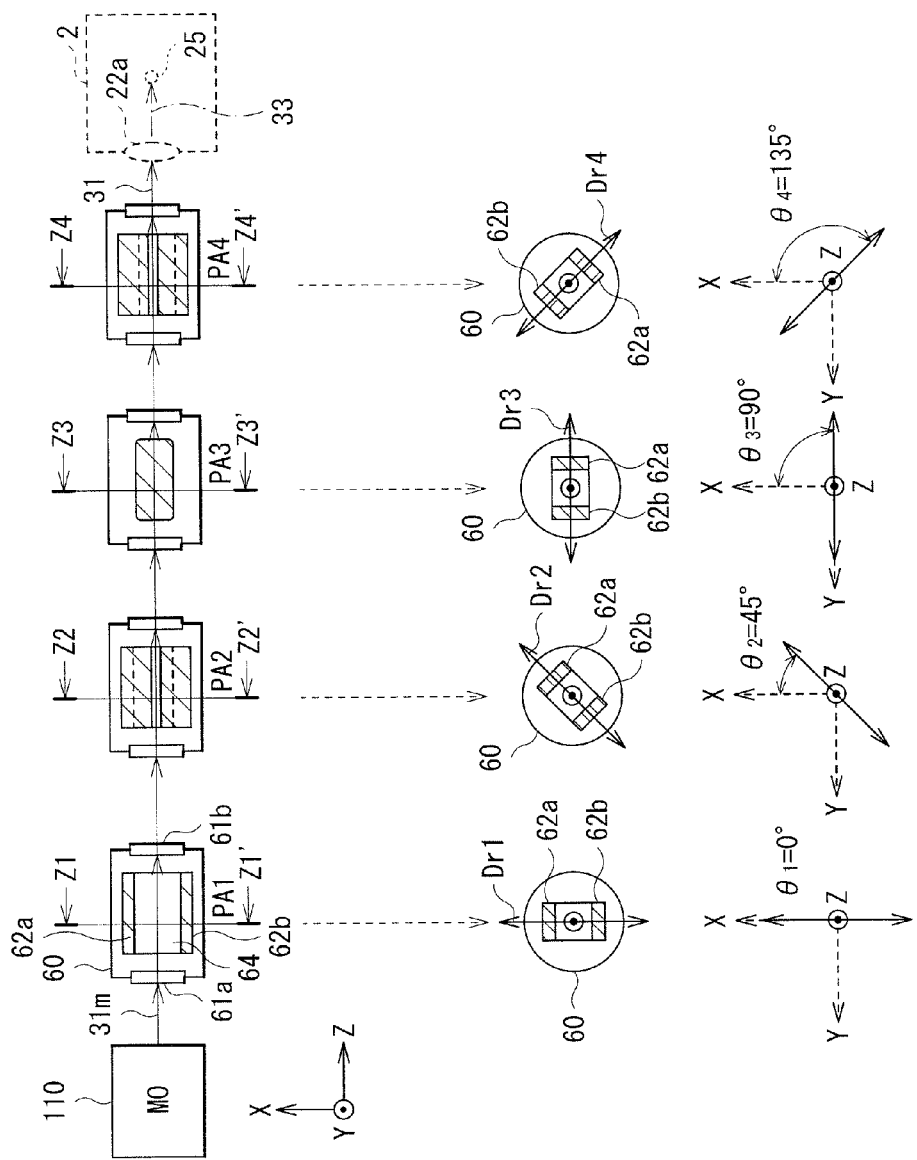
FIG. 6 schematically illustrates a configuration example of a laser unit according to a second embodiment.

With reference to FIG. 6, description is given of a configuration of a laser unit according to a second embodiment of the disclosure. An upper stage in FIG. 6 schematically illustrates a configuration example viewed from the Y direction of the laser unit according to the second embodiment. A middle stage and a lower stage in FIG. 6 schematically illustrate a relationship of the direction of discharge by the pair of electrodes 62a and 62b in each of a plurality of amplifiers PA1, PA2, PA3, and PA4 in the laser unit according to the second embodiment.

In the configuration of the laser unit 3 illustrated in FIG. 2, the opposing direction of the pair of electrodes 62a and 62b in one of the plurality of amplifiers PAL. PA2, . . . , PAk, . . . , and PAn may be different from the opposing direction of the pair of electrodes 62a and 62b in another one of the plurality of amplifiers PA1, PA2, . . . , PAk, . . . and PAn. In each of the plurality of amplifiers PA1, PA2, . . . , PAk, . . . , and PAn, the opposing direction of the pair of electrodes 62a and 62b may be same as the direction of discharge by the pair of electrodes 62a and 62b.

FIG. 6 illustrates a configuration example of a laser unit including four amplifiers PA1, PA2, PA3, and PA4 as the plurality of amplifiers PA1, PA2, . . . , PAk, . . . , and PAn. FIG. 6 illustrates a configuration example of the laser unit including these four amplifiers PA1, PA2, PA3, and PA4 that are so disposed as to allow the directions of discharge in the amplifiers PA1, PA2, PA3, and PA4 to be different from one another. The four amplifiers PA1, PA2, PA3, and PA4 may include same components, other than positional relationship, as components of the amplifiers in the laser unit 3 illustrated in FIG. 2.

The middle stage in FIG. 6 schematically illustrates a section taken along line Z1-Z1' of the amplifier PA1 illustrated in the upper stage in FIG. 6, a section taken along line Z2-Z2' of the amplifier PA2 illustrated in the upper stage in FIG. 6, a section taken along line Z3-Z3' of the amplifier PA3 illustrated in the upper stage in FIG. 6, and a section taken along line Z4-Z4' of the amplifier PA4 illustrated in the upper stage in FIG. 6.

As illustrated in FIG. 6, in the amplifier PA1, the pair of electrodes 62a and 62b may be disposed to oppose each other in a direction forming an angle θ1=0° with the X axis, thereby allowing a direction of discharge Dr1 to form the angle $\theta_1$=0° with the X axis. In the amplifier PA2, the pair of electrodes 62a and 62b may be disposed to oppose each other in a direction forming an angle $\theta_2$=45° with the X axis, thereby allowing a direction of discharge Dr2 to form the angle θ2=45° with the X axis. In the amplifier PA3, the pair of electrodes 62a and 62b may be disposed to oppose each other in a direction forming an angle $\theta_3$=90° with the X axis, thereby allowing a direction of discharge Dr3 to form the angle $\theta_3$=90° with the X axis. In the amplifier PA4, the pair of electrodes 62a and 62b may be disposed to oppose each other in a direction forming an angle $\theta_4$=135° with the X axis, thereby allowing a direction of discharge Dr4 to form an angle $\theta_4$=135° with the X axis.

5.2 Operation

In the laser unit illustrated in FIG. 6, the pulsed laser light 31m outputted from the master oscillator 110 may pass through each of the four amplifiers PA1, PA2, PA3, and PA4 to be subjected to amplification. In the configuration of the laser unit 3 illustrated in FIG. 2, the pairs of electrodes 62a and 62b in the respective amplifiers may be disposed to oppose each other in a same direction, thereby allowing the directions of discharge by the respective amplifiers to be same as one another. Thus, in the laser unit 3 illustrated in FIG. 2, the ASE light 36 reflected by the surfaces of the pair of electrodes 62a and 62b in one of the amplifiers may enter the surfaces of the pair of electrodes 62a and 62b in another one of the amplifiers. In the laser unit illustrated in FIG. 6, the pair of the electrodes 62a and 62b in each of the amplifiers may be disposed to oppose each other in a different direction for each of the amplifiers, thereby allowing the directions of discharge by the amplifiers to be different from one another. Thus, in the laser unit illustrated in FIG. 6, even if the ASE light 36 reflected by the surfaces of the pair of electrodes 62a and 62b in one of the amplifiers obliquely enters the surfaces of the pair of electrodes 62a and 62b in another one of the amplifiers, reflectivity may be decreased. This may suppress self-oscillation.

5.3 Action

According to the second embodiment, a plurality of amplifiers may be disposed so that the direction of discharge in one or more amplifiers of the plurality of amplifiers is different from the direction of discharge in another one of the plurality of amplifiers. This may suppress reflection of self-oscillation light by the surfaces of the pair of electrodes 62a and 62b.

5.4 Others

Although FIG. 6 illustrates a configuration example provided with four amplifiers, the number of amplifiers is not limited to four, and a number n of amplifiers may be so disposed as to satisfy the following relationship. In the relationship, the pair of electrodes 62a and 62b in the kth amplifier PAk may be disposed to oppose each other in a direction forming an angle θk with the X axis, thereby allowing a direction of discharge Drk by the kth amplifier PAk to form the angle θk with the X axis.

$$\theta k = (k-1) \cdot \theta_0, \text{ and } \theta_0 = 180°/n$$

6. Third Embodiment 6.1 Configuration

Figure 7:
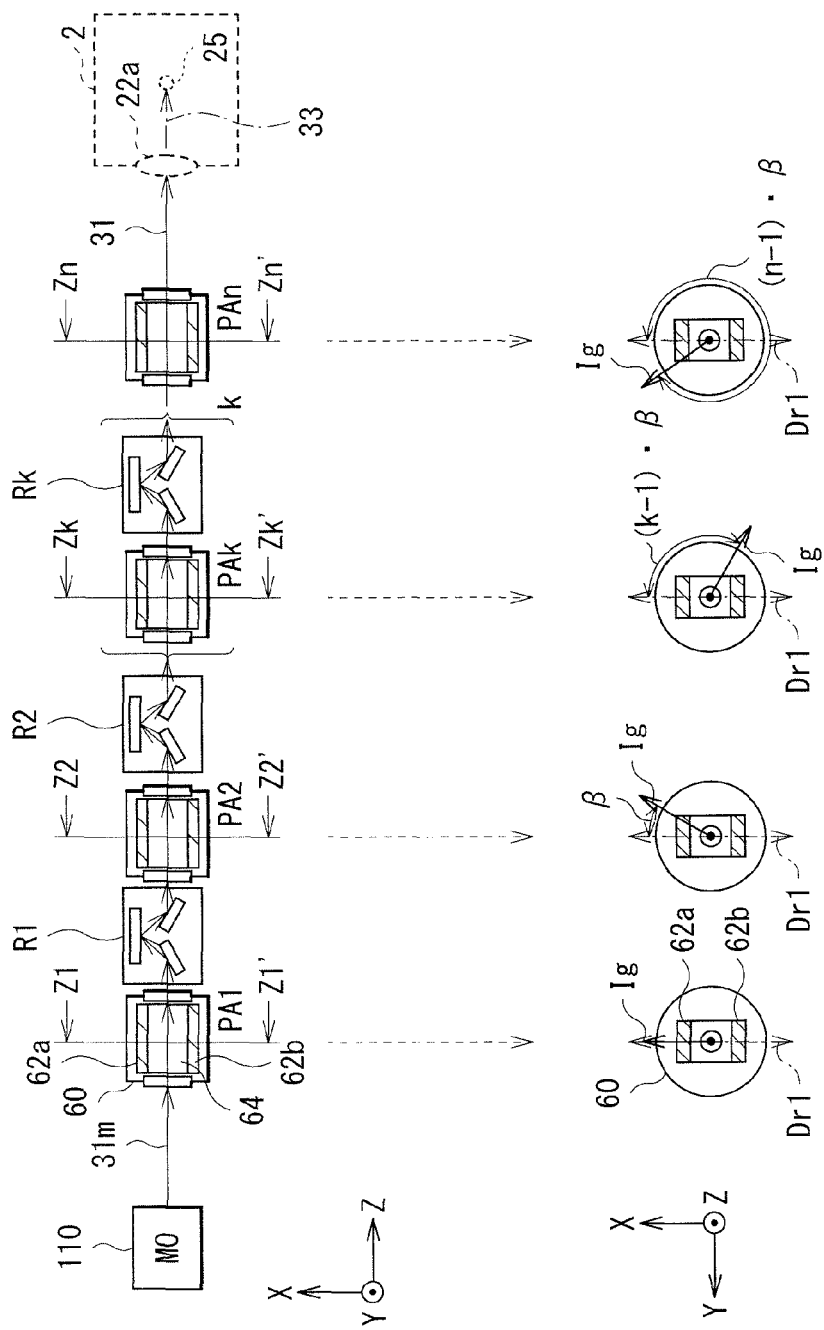
FIG. 7 schematically illustrates a configuration example of a laser unit according to a third embodiment.

With reference to FIG. 7, description is given of a configuration of a laser unit according to a third embodiment of the disclosure. An upper stage in FIG. 7 schematically illustrates a configuration example viewed from the Y direction of the laser unit according to the third embodiment. A lower stage in FIG. 7 schematically illustrates a section taken along line Z1-Z1' of the amplifier PA1 illustrated in the upper stage in FIG. 7, a section taken along line Z2-Z2' of the amplifier PA2 illustrated in the upper stage in FIG. 7, a section taken along line Zk-Zk' of the amplifier PAk illustrated in the upper stage in FIG. 7, and a section taken along line Zn-Zn' of the amplifier PAn illustrated in the upper stage in FIG. 7.

In the laser unit 3 illustrated in FIG. 2, one or more image rotators may be disposed between adjacent two of the plurality of amplifiers PA1, PA2, . . . , PAk, . . . , and PAn. For example, as illustrated in FIG. 7, an image rotator R1 may be disposed between the amplifier PA1 and the amplifier PA2. An image rotator R2 may be disposed between the amplifier PA2 and the amplifier PA3. An image rotator Rk may be disposed between the amplifier PAk and an amplifier PAk+1. Although not illustrated, an image rotator Rn may be disposed between an amplifier PAn−1 and the amplifier PAn. The plurality of amplifiers PA1, PA2, . . . , PAk, . . . , and PAn illustrated in FIG. 7 may include same components as the components of the amplifiers in the laser unit 3 illustrated in FIG. 2.

As illustrated in the lower stage in FIG. 7, the pair or electrodes 62a and 62b in each of the plurality of amplifiers PA1, PA2, . . . , PAk, . . . , and PAn may be disposed to oppose each other in a direction forming an angle of 0° with the X axis, thereby allowing the direction of discharge Dr1 to form an angle of 0° with the X axis. The image rotators may each rotate light around an optical path axis, as center of rotation, of the pulsed laser light 31m outputted from the master oscillator 110. The lower stage in FIG. 7 illustrates a state in which the plurality of image rotators R1, R2, . . . , Rk, . . . , and Rn each rotate a certain light component Ig by a rotation angle β. FIG. 7 illustrates that the certain light component Ig in the amplifier PA1 is aligned with the X-axis direction. In a case where a number n of amplifiers are provided, for example, the rotation angle β of the pulsed laser light 31m by one image rotator may be set to an angle in the following expression.

$$\beta = 180°/n$$

6.2 Operation

In the laser unit illustrated in FIG. 7, the pulsed laser light 31m outputted from the master oscillator 110 may pass through the amplifiers PA1, PA2, . . . , PAk, . . . , and PAn to be subjected to amplification. In the configuration of the laser unit 3 illustrated in FIG. 2, the pairs of electrodes 62a and 62b in the respective amplifiers may be disposed to oppose each other in a same direction, thereby allowing the directions of discharge by the respective amplifiers to be same as one another. Thus, in the laser unit 3 illustrated in FIG. 2, the ASE light 36 reflected by the surfaces of the pair of electrodes 62a and 62b in one of the amplifiers may enter the surfaces of the pair of electrodes 62a and 62b in another one of the amplifiers. In the laser unit illustrated in FIG. 7, the respective amplifiers may be disposed in a similar manner to that in the laser unit 3 illustrated in FIG. 2. As illustrated in FIG. 7, providing the image rotator between adjacent two of the amplifiers may decrease reflectivity even if the ASE light 36 reflected by the surfaces of the pair of electrodes 62a and 62b in one of the amplifiers obliquely enters the surfaces of the pair of electrodes 62a and 62b in another one of the amplifiers.

6.3 Action

According to the third embodiment, the image rotator may rotate a beam of laser light between adjacent two of the amplifiers. This may suppress reflection of self-oscillation light by the surfaces of the pair of electrodes 62a and 62b.

6.4 Modification Example
6.4.1 Configuration

Figure 8:
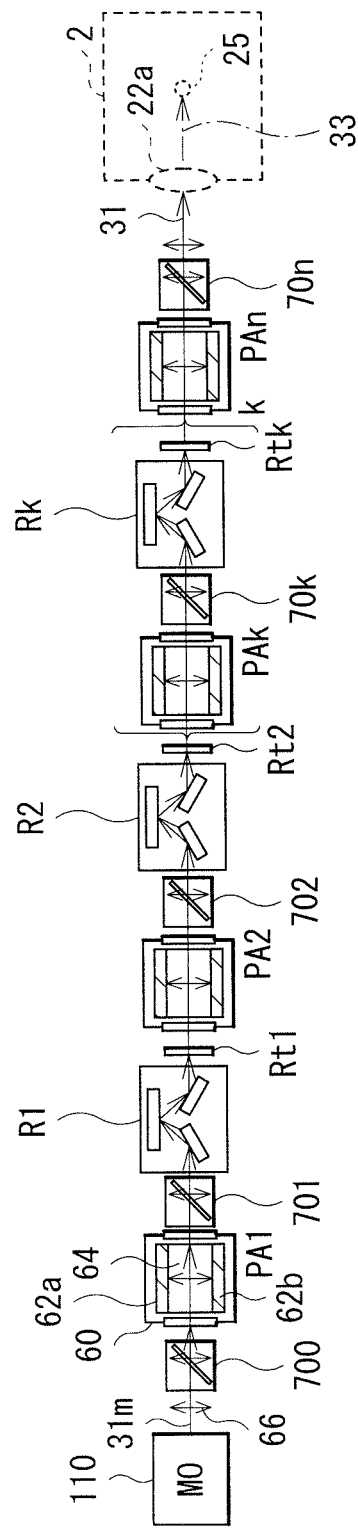
FIG. 8 schematically illustrates a modification example of the laser unit according to the third embodiment.

With reference to FIG. 8, description is given of a configuration of a modification example of the laser unit according to the third embodiment of the disclosure. The laser unit according to the modification example may be a combination of the foregoing first embodiment illustrated in FIGS. 3 to 5 and the foregoing third embodiment illustrated in FIG. 7.

The laser unit according to the modification example may include a plurality of image rotators R1, R2, ..., Rk, ..., and Rn−1 as in the laser unit illustrated in FIG. 7. The laser unit according to the modification example may further include a plurality of polarization units 700, 701, 702, ..., 70k, ..., and 70n and a plurality of retarders Rt1, Rt2, ..., Rtk, ..., and Rtn−1.

The master oscillator 110 may output, as the pulsed laser light 31m, linear-polarized laser light of a predetermined polarized component. The predetermined component may be a component 66 in the X-axis direction in FIG. 7. The plurality of polarization units 700, 701, 702, ..., 70k, ..., and 70n may each be provided with a polarization axis substantially aligned with the polarization direction of the pulsed laser light 31m. The plurality of polarization units 700, 701, 702, ..., 70k, ..., and 70n may each include a transmission polarizer. The transmission polarizer may allow the predetermined polarized component to pass therethrough toward a predetermined direction. Alternatively, the plurality of polarization units 700, 701, 702, ..., 70k, ..., and 70n may each include a reflection polarizer. The reflection polarizer may reflect the predetermined polarized component toward a predetermined direction.

The plurality of amplifiers PA1, PA2, ..., PAk, ..., and PAn may each include the pair of electrodes 62a and 62b disposed to oppose each other so that the direction of discharge Dr1 by the pair of electrodes 62a and 62b is substantially aligned with the polarization direction of the pulsed laser light 31m as in the configuration example in FIGS. 3 to 5. The direction of discharge Dr1 by the pair of electrodes 62a and 62b may be the X-axis direction as illustrated in FIG. 5. The direction of discharge Dr1 by the pair of electrodes 62a and 62b may be same as the opposing direction of the pair of electrodes 62a and 62b. The pair of electrodes 62a and 62b may be disposed to oppose each other so that the opposing direction of the pair of electrodes 62a and 62b is substantially aligned with a direction of the polarization axes of the plurality of polarization units 700, 701, 702, ..., 70k, ..., and 70n. The polarization direction of the amplified pulsed laser light 31m outputted from the plurality of amplifiers PA1, PA2, ..., PAk, ..., and PAn may be substantially aligned with the direction of the polarization axes of the plurality of polarization units 700, 701, 702, ..., 70k, ..., and 70n.

The polarization unit 700 may be disposed between the master oscillator 110 and the amplifier PA1 and may be so disposed as to output light in a direction substantially same as the polarization direction of the pulsed laser light 31m from the master oscillator 110. The polarization unit 701 may be disposed between the amplifier PA1 and the image rotator R1 and may be so disposed as to output light in a polarization direction substantially same as the direction of discharge by the amplifier PA1. The image rotator R1 may be disposed between the polarization unit 701 and the retarder Rt1 and may be so disposed as to rotate, by the predetermined angle β, a beam of the pulsed laser light 31m amplified by the amplifier PA1. The retarder Rt1 may be a wave plate that changes a phase of entered light by λ/2. The retarder Rt1 may be so disposed as to rotate the polarization direction of entered light by −β. In other words, the retarder Rt1 may be so disposed as to allow an angle between an optical axis of the wave plate and the polarization direction to be −β/2.

The polarization unit 70k may be disposed between the amplifier PAk and the image rotator Rk and may be so disposed as to output light in a polarization direction substantially same as the direction of discharge by the amplifier PAk. The image rotator Rk may be disposed between the polarization unit 70k and the retarder Rtk and may be so disposed as to rotate, by the predetermined angle β, the beam of the pulsed laser light 31m amplified by the amplifier PAk. The polarization unit 70n may be disposed between the amplifier PAn and the laser concentrating optical system 22a and may be so disposed as to output light in a polarization direction substantially same as the direction of discharge by the amplifier PAn.

6.4.2 Operation

The linear-polarized pulsed laser light 31m outputted from the master oscillator 110, while maintaining its polarization state, may enter the amplifier PA1 via the polarization unit 700 to be subjected to amplification. The amplified pulsed laser light 31m outputted from the amplifier PA1 may enter the image rotator R1 via the polarization unit 701 while maintaining its polarization state. The beam of the amplified pulsed laser light 31m may pass through the image rotator R1 to be rotated around the optical path axis, as center of rotation, of the pulsed laser light 31m by the angle β. As a result, the polarization direction of the amplified pulsed laser light 31m may be rotated by the angle β. The retarder Rt1 may rotate, by −β, the polarization direction of the pulsed laser light 31m having passed through the image rotator R1. The pulsed laser light 31m of which the polarization direction is substantially aligned with the direction of discharge may therefore enter the amplifier PA2 as seed light. Thereafter, similar operation may be repeated to appropriately rotate a beam of the seed light so that the polarization direction of the seed light entering the amplifier PAk is substantially aligned with the direction of discharge by the amplifier PAk.

6.4.3 Action

According to the modification example, the polarization direction of the seed light entering the amplifier may be substantially aligned with the direction of discharge by the amplifier, as well as the beam of the seed light may be rotated, which may further suppress reflection of self-oscillation light by the surfaces of the pair of electrodes 62a and 62b.

7. Fourth Embodiment

Figure 9:
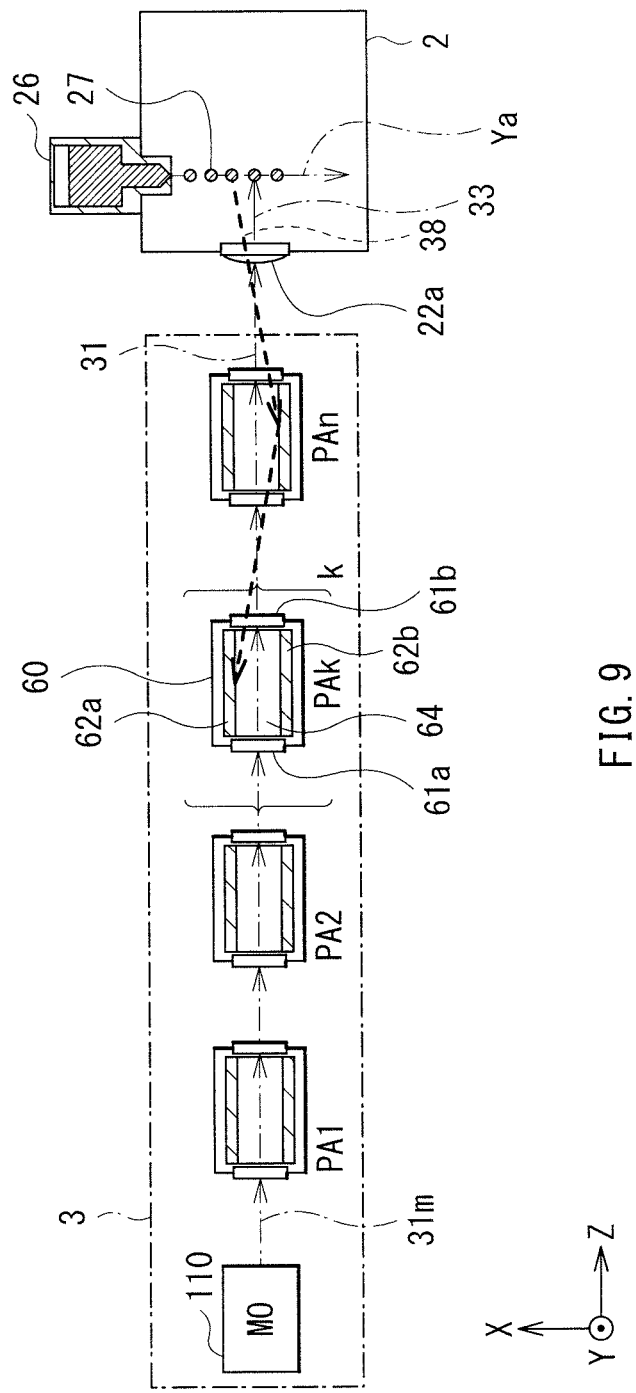
FIG. 9 schematically illustrates a configuration example viewed from the Y direction of a laser unit according to a comparative example.
Figure 10:
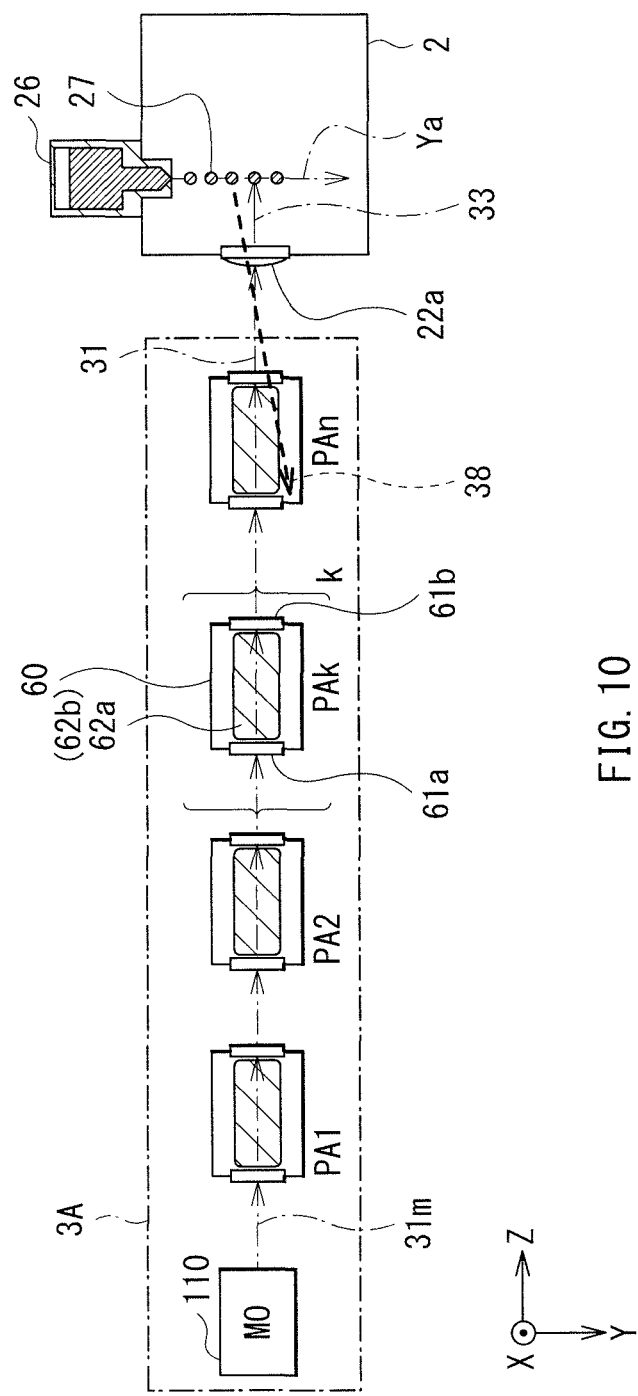
FIG. 10 schematically illustrates a configuration example viewed from the X direction of a laser unit according to a fourth embodiment.

FIG. 9 schematically illustrates a configuration example viewed from the Y direction of the laser unit 3 according to a comparative example. FIG. 10 schematically illustrates a configuration example viewed from the X direction of a laser unit 3A according to a fourth embodiment.

The pulsed laser light 31 outputted from the laser unit 3 according to the comparative example illustrated in FIG. 9 may enter the chamber 2 serving as a plasma chamber in the EUV light generating apparatus 1 illustrated in FIG. 1, and the thus-entered pulsed laser light 31 may be concentrated on the inside of the chamber 2 by the laser concentrating optical system 22a. The concentrated pulsed laser light 33 may be applied to the target 37 fed from the target feeder 26. Accordingly, the target 27 may turn into plasma inside the chamber 2, and EUV light may be radiated from the plasma.

In the laser unit 3 according to the comparative example, the pairs of electrodes 62a and 62b in the plurality of amplifiers PA1, PA2, . . . , PAk, . . . , and PAn may be disposed to oppose each other in a direction substantially aligned with a trajectory axis Ya of the target 27, thereby allowing the directions of discharge by the plurality of amplifiers PA1, PA2, . . . , PAk, . . . , and PAn to be substantially aligned with the trajectory axis Ya of the target 27. In the laser unit 3 according to the comparative example, the direction of discharge by the pair of electrodes 62a and 62b, the opposing direction of the pair of electrodes 62a and 62b, and the trajectory axis Ya may be substantially aligned with the X-axis direction. In this situation, reflected light 38 being derived from the target 27 and having reversely-traveled from the target 27 in the off-axis direction of the pulsed laser light 31 may enter surfaces opposing each other of the pair of electrodes 62a and 62b in, for example, the amplifier PAn, and may be further reflected toward and enter another one of the amplifiers. As a result, the reflected light 38 may be amplified by the amplifier PAn and another amplifier to be turned to self-oscillation light.

The laser unit 3A illustrated in FIG. 10 may be configured not to allow the reflected light 38 being derived from the target 27 and having reversely-traveled from the target 27 in an off-axis direction of the pulsed laser light 31 to enter the surfaces opposing each other of the pair of electrodes 62a and 62b in the amplifier PAn. For example, the opposing direction of the pair of electrodes 62a and 62b may be brought into rotational alignment around an optical path axis, as center of rotation, of laser light to allow the direction of discharge by the pair of electrodes 62a and 62b in the amplifier PAn and the opposing direction of the pair of electrodes 62a and 62b in the amplifier PAn to be inclined with respect to, for example, the trajectory axis Ya of the target 27. Preferably, the opposing direction of the pair of electrodes 62a and 62b may be so aligned to be substantially orthogonal to the trajectory axis Ya of the target 27. For example, as illustrated in FIG. 10, in a case where the trajectory axis Ya of the target 27 is in the Y-axis direction, the opposing direction of the pair of electrodes 62a and 62b may be aligned with the X-axis direction. This may prevent the reflected light 38 derived from the target 27 from reaching the surfaces of the pair of electrodes 62a and 62b in the amplifier PAn and being reflected by the surfaces of the pair of electrodes 62a and 62b in the amplifier PAn.

Note that the foregoing description has been given of an example in which an optical path of laser light from the master oscillator 110 to a light-concentrating position inside the chamber 2 is a straight line; however, even if the optical path of laser light is not a straight line, propagation of the reflected light 38 may be suppressed in a similar way to the foregoing way. Even if the optical path of the laser light is not a straight line, the opposing direction of the pair of electrodes 62a and 62b may be so aligned according to the state of the optical path of the laser light as to prevent the reflected light 38 from being incident upon the surfaces of the electrodes.

[8. Variations of Laser Amplifier]
8.1 Triaxial Orthogonal Amplifier

Figure 11:
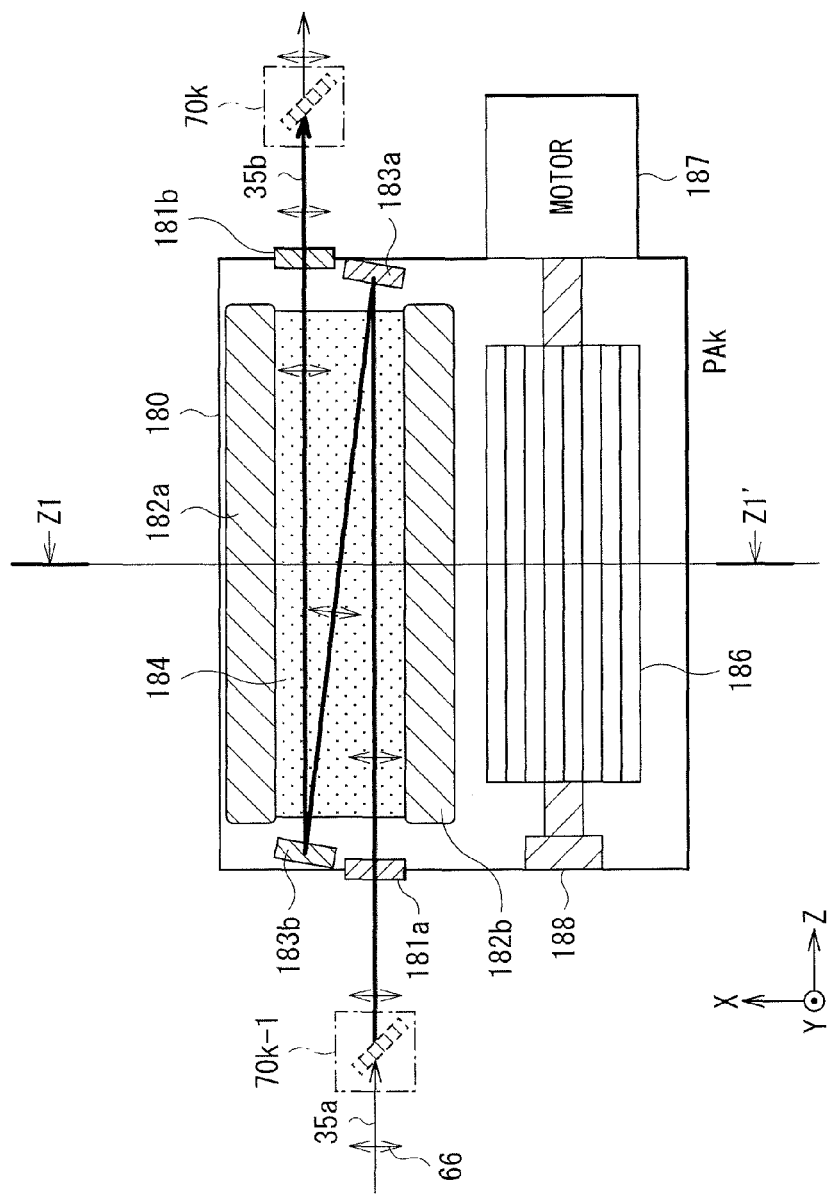
FIG. 11 schematically illustrates a configuration example of a triaxial orthogonal amplifier.
Figure 12:
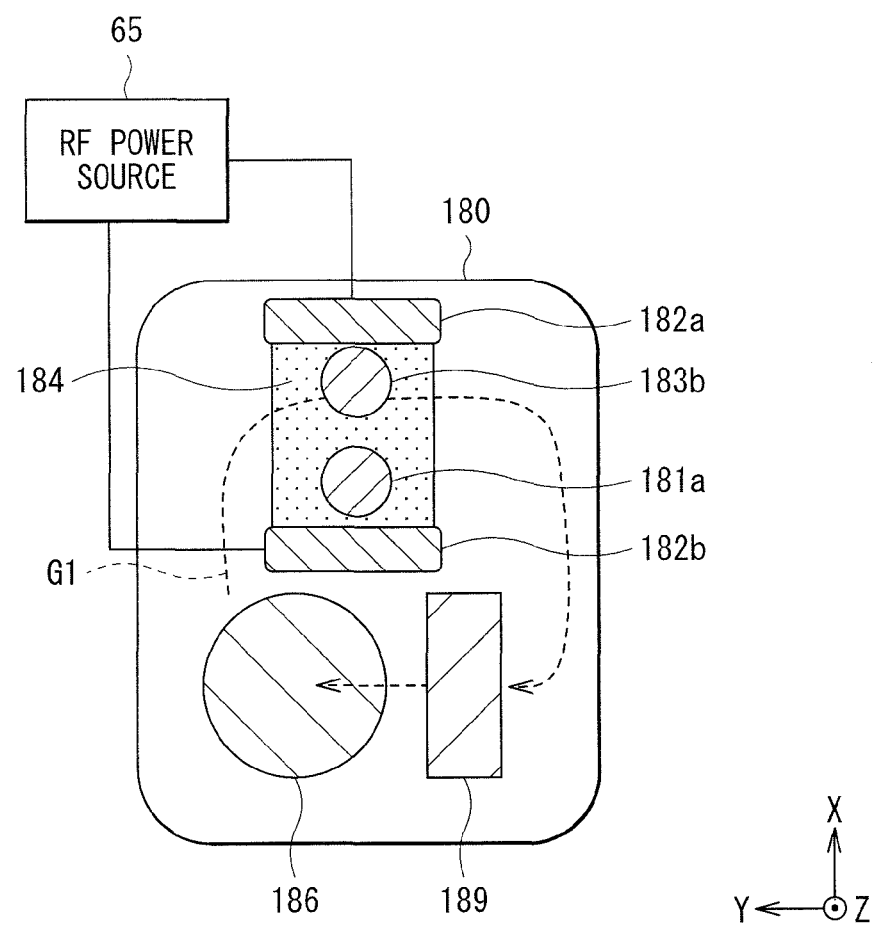
FIG. 12 schematically illustrates a configuration example, taken along line Z1-Z1' of FIG. 11, of the triaxial orthogonal amplifier illustrated in FIG. 11.

FIG. 11 illustrates a configuration example of a triaxial orthogonal amplifier as another example of the amplifier PAk illustrated in FIGS. 3 and 4. FIG. 12 illustrates a sectional configuration example, taken along line Z1-Z1' line of FIG. 11, of the triaxial orthogonal amplifier illustrated in FIG. 11.

The triaxial orthogonal amplifier may include a laser chamber 180, an input window 181a, an output window 181b, a pair of electrodes 182a and 182b, a first mirror 183a, a second mirror 183b, a cross flow fan 186, and an RF power source 65. The triaxial orthogonal amplifier may further include a heat exchanger 189. A motor 187 and a bearing 188 may be coupled to respective ends of the cross flow fan 186.

The laser chamber 180 may contain $CO_2$ laser gas as a laser medium. The pair of electrodes 182a and 182b and the RF power source 65 may configure an excitation unit that excites the laser medium to amplify the seed light 35a having entered the inside of the laser chamber 180. The pair of electrodes 182a and 182b may be provided inside the laser chamber 180 and may excite the laser medium by discharge in a discharge region 184. An electrode interval between the pair of electrodes 182a and 182b may be, for example, 10 mm to 60 mm both inclusive. The RF power source 65 may apply an RF voltage to the pair of electrodes 182a and 182b.

In the triaxial orthogonal amplifier, the cross flow fan 186 may circulate laser gas GI between the pair of electrodes 182a and 182b to supply the laser gas GI to the pair of electrodes 182a and 182b. While supplying the RF voltage from the RF power source 65 to the pair of electrodes 182a and 182b, laser light to serve as seed light 35a may enter the inside of the lasers chamber 180 through the input window 181a. The entered seed light 35a may be so reflected between the first mirror 183a and the second mirror 183b as to make multiple passes in the discharge region 184. The entered seed light 35a may make multiple passes through the laser medium excited between the pair of electrodes 182a and 182b to be subjected to amplification. The thus-amplified seed light 35a may be outputted from the output window 181b as amplified laser light 35b.

As in this configuration example, a ratio of a polarized component in a direction orthogonal to the direction of discharge in polarized components of self-oscillation light may be increased with an increase in number N of passes of the seed light 35a in the discharge region 184. For example, when the number N of passes is five, the ratio of the polarized components of the self-oscillation light may be a ratio of "the polarized component in the direction orthogonal to the direction of discharge to a component in a direction aligned with the direction of discharge" of "40:1".

Thus, as in the configuration example in FIGS. 3 to 5, the seed light 35a in a polarization direction substantially aligned with the direction of discharge Dr1 may enter the amplifier that allows the seed light 35a to make multiple passes. Moreover, the first polarization unit 70k–1 and the second polarization unit 70k may be provided in optical paths before and after the amplifier. The first polarization unit 70k–1 and the second polarization unit 70k may allow light in a polarization direction same as the polarization direction of the seed light 35a to pass therethrough. In other words, as in the configuration example in FIGS. 3 to 5, the pair of electrodes 182a and 182b may be disposed to oppose each other so that the direction of discharge Dr1 is substantially aligned with the polarization direction of the seed light 35a. The direction of discharge Dr1 by the pair of electrodes 182a and 182b may be the X-axis direction as in the configuration example in FIG. 5. The direction of discharge Dr1 by the pair of electrodes 182a and 182b may be same as the opposing direction of the pair of electrodes 182a and 182b. The pair of electrodes 182a and 182b may be disposed to oppose each other so that the opposing direction of the pair of electrodes 182a and 182b is substantially aligned with a direction of the polarization axes of the first polarization unit 70k–1 and the second polarization unit 70k. This may suppress reflection of self-oscillation light by the surfaces of the pair of electrodes 182a and 182b.

Note that the triaxial orthogonal amplifier illustrated in FIGS. 11 and 12 may be used as a laser amplifier in the laser unit according to any of the foregoing second to fourth embodiments.

8.2 Slab Amplifier

Figure 13:
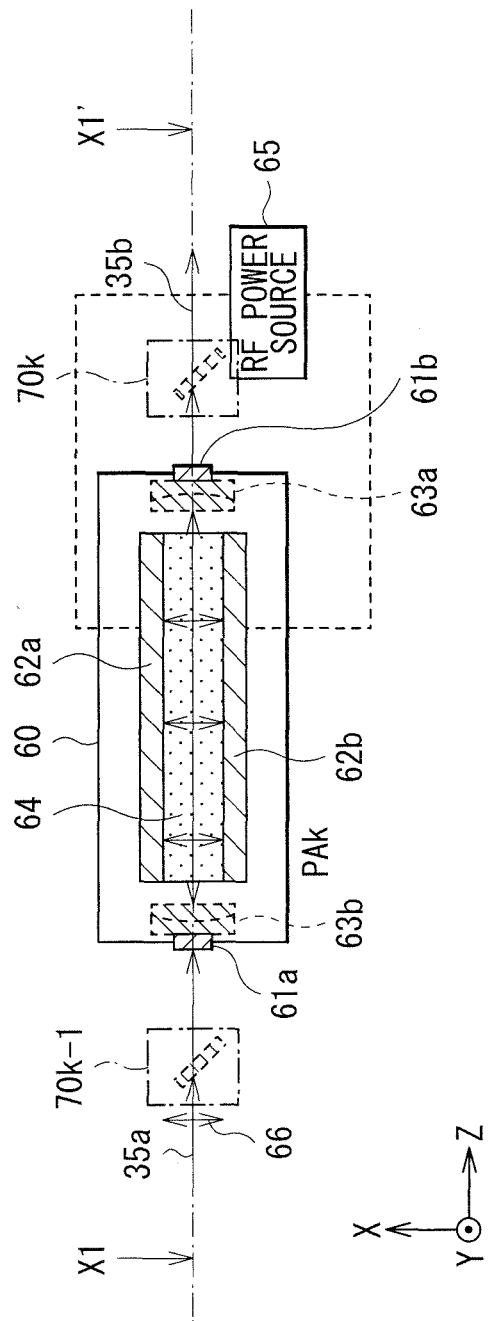
FIG. 13 schematically illustrates a configuration example of a slab amplifier.
Figure 14:
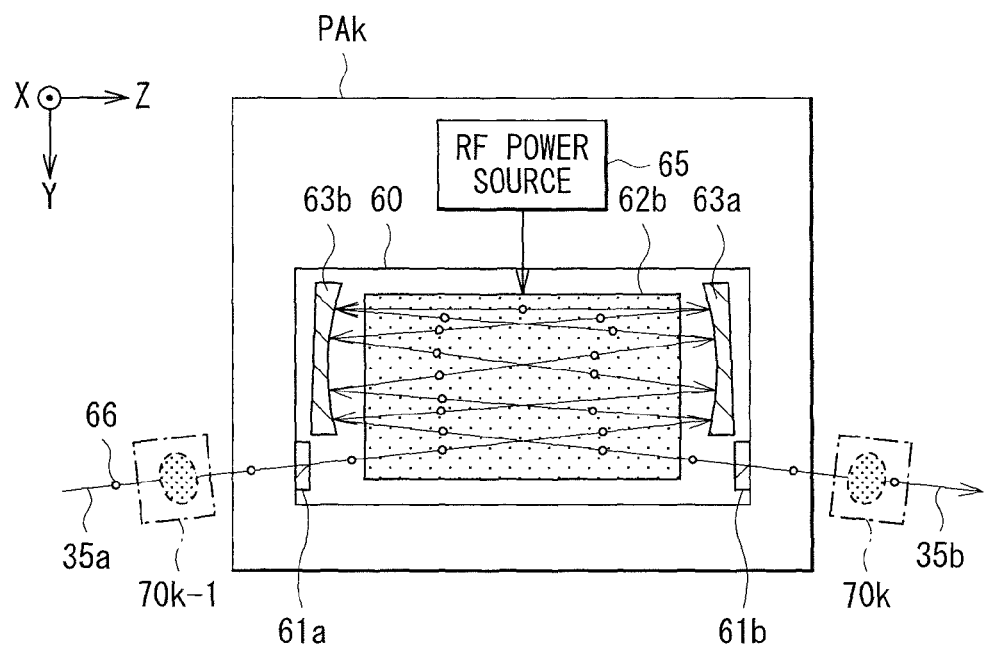
FIG. 14 schematically illustrates a configuration example, taken along line X1-X1' of FIG. 13, of the slab amplifier illustrated in FIG. 13.

FIG. 13 illustrates a configuration example of a slab amplifier as another example of the amplifier PAk illustrated in FIGS. 3 and 4. FIG. 14 illustrates a sectional configuration example, taken along line X1-X1' of FIG. 13, of the slab amplifier illustrated in FIG. 13.

The amplifier PAk may be a slab amplifier provided with the laser chamber 60 and the pair of tabular electrodes 62a and 62b. The laser chamber 60 may contain $CO_2$ laser gas as a laser medium. Unillustrated cooling water flows through the pair of electrodes 62a and 62b. The pair of electrodes 62a and 62b may be disposed to oppose each other. The slab amplifier may include the laser chamber 60, the input window 61a, the output window 61b, the pair of electrodes 62a and 62b, a first concave mirror 63a, a second concave mirror 63b, and the RF power source 65. An electrode interval between the pair of electrodes 62a and 62b may be, for example, 1.5 mm to 6 mm both inclusive.

In the slab amplifier, laser light to serve as the seed light 35a may enter the inside of the laser chamber 60 through the input window 61a while supplying an RF voltage from the RF power source 65 to the pair of electrodes 62a and 62b. The entered seed light 35a may be so reflected by the first concave mirror 63a and the second concave mirror 63b as to make multiple passes in the discharge region 64. The entered seed light 35a may make multiple passes through the laser medium excited between the pair of electrodes 62a and 62b to be subjected to amplification. The thus-amplified seed light 35a may be outputted as amplified laser light 35b from the output window 61b.

As in the case of the foregoing triaxial orthogonal amplifier, in the slab amplifier that allows the seed light 35a to make multiple passes in the discharge region, the ratio of the polarized component in the direction orthogonal to the direction of discharge in the polarization components of the self-oscillation light may be increased with an increase in the number N of passes. In a similar manner to that in the configuration example in FIGS. 3 to 5, the first polarization unit 70k–1 and the second polarization unit 70k may be provided in optical paths before and after the slab amplifier. The first polarization unit 70k–1 and the second polarization unit 70k may allow light in a polarization direction same as the polarization direction of the seed light 35a to pass therethrough. This may suppress reflection of the self-oscillation light by the pair of electrodes 62a and 62b.

Note that the slab amplifier illustrated in FIGS. 13 and 14 may be used as a laser amplifier in the laser unit according to any of the foregoing second to fourth embodiments.

[9. Variations of Polarization Unit]

9.1 Transmission Polarizer

Figure 15:
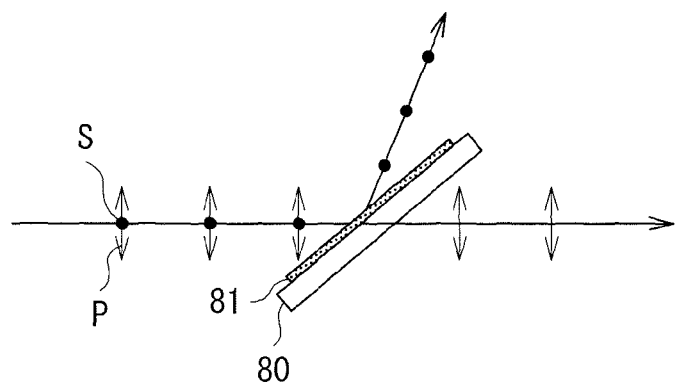
FIG. 15 schematically illustrates a configuration example of a transmission polarizer.

FIG. 15 illustrates a configuration example of a transmission polarizer as an example of the first polarization unit 70k–1 and the second polarization 70k illustrated in FIGS. 3 and 4. The transmission polarizer may include a substrate 80 and a multilayer film 81. The substrate 80 may allow laser light to pass therethrough. The substrate 80 may be coated with the multilayer film 81. The multilayer film 81 may allow a P-polarized component with respect to an entrance surface of laser light to pass therethrough at high transmittance and may reflect an S-polarized component with respect to the entrance surface of the laser light at high reflectivity. Examples of a material of the substrate 80 may include ZnSe, GaAs, and diamond that allow $CO_2$ laser light to pass therethough.

9.2 Reflection Polarizer

Figure 16:
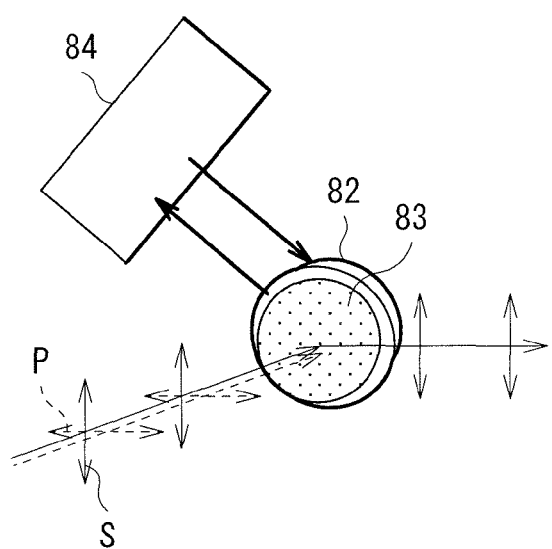
FIG. 16 schematically illustrates a configuration example of a reflection polarizer.

FIG. 16 illustrates a configuration example of a reflection polarizer as another example of the first polarization unit 70k–1 and the second polarization unit 70k illustrated in FIGS. 3 and 4. The reflection polarizer may include a substrate 82 and a film 83. The substrate 82 may be coated with the film 83. The substrate 82 may be cooled by a cooling device 84. The film 83 may reflect an S-polarized component with respect to an entrance surface of laser light at high reflectivity and may absorb a P-polarized component. Since a thermal load in a high-power $CO_2$ laser unit is high, using the reflection polarizer that is cooled by the cooling device 84 may suppress wavefront distortion of reflected light.

9.3 Example of Combination of Plurality of Reflection Polarizers

Figure 17:
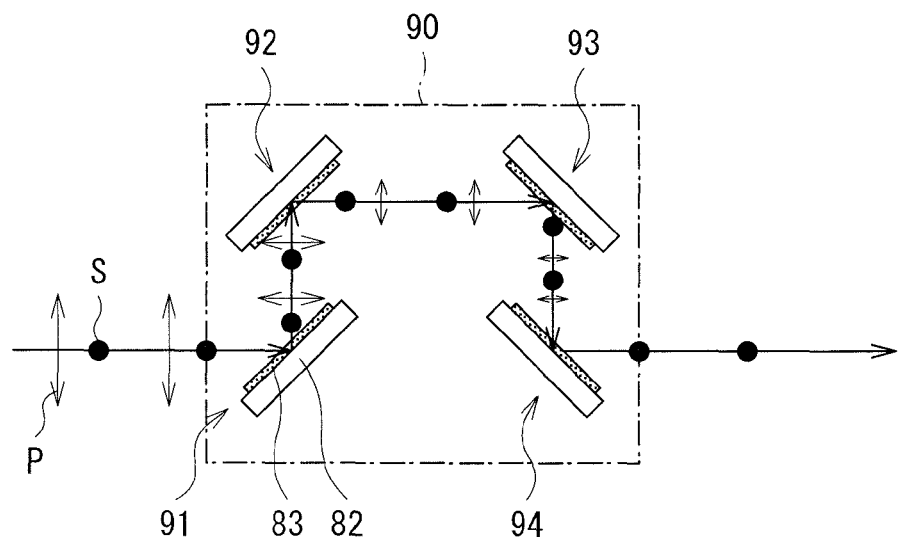
FIG. 17 schematically illustrates a configuration example of a polarization unit including a combination of a plurality of reflection polarizers.

FIG. 17 illustrates a configuration example of a polarization unit 90 including a combination of a plurality of reflection polarizers as still another example of the first polarization unit 70k–1 and the second polarization unit 70k illustrated in FIGS. 3 and 4. The polarization unit 90 may include four reflection polarizers 91, 92, 93, and 94. The reflection polarizers 91, 92, 93, and 94 may each include a substrate 82 and a film 83 with which the substrate 82 is coated as in the reflection polarizer illustrated in FIG. 16. Although not illustrated in FIG. 17, the substrate 82 may be cooled by a cooling device. As illustrated in FIG. 17, the reflection polarizers 91, 92, 93, and 94 may each be disposed to allow an entry angle of the laser light to be 45° in a plane including a paper surface.

In the polarization unit 90, the four reflection polarizers 91, 92, 93, and 94 may each reflect the S-polarized component of entered light at high reflectivity and may absorb the P-polarized component of the entered light. Although FIG. 17 illustrates an example of the combination of the four reflection polarizers 91, 92, 93, and 94, the number of reflection polarizers in the combination is not limited to four. Increasing the number of reflection polarizers in the combination may increase an extinction ratio in the entire polarization unit.

[10. Variations of Image Rotator]

10.1 Image Rotator Using Dove Prism

Figure 18:
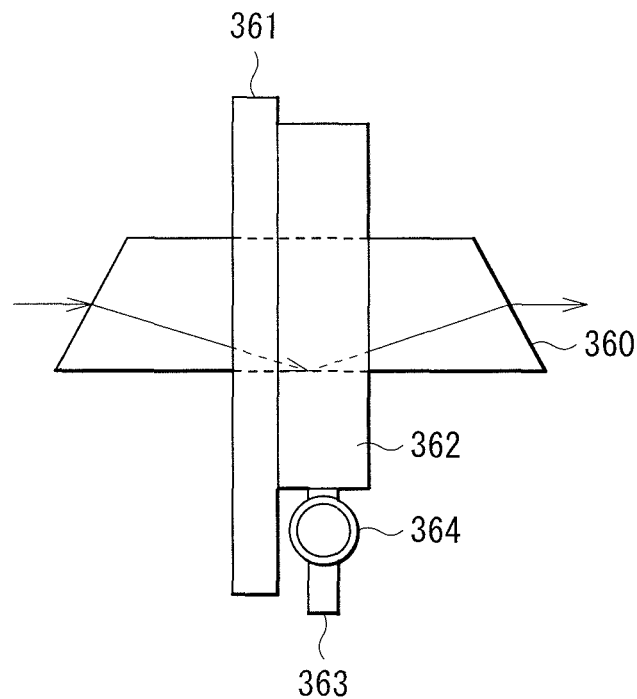
FIG. 18 schematically illustrates a configuration example of an image rotator using a dove prism.
Figure 19:
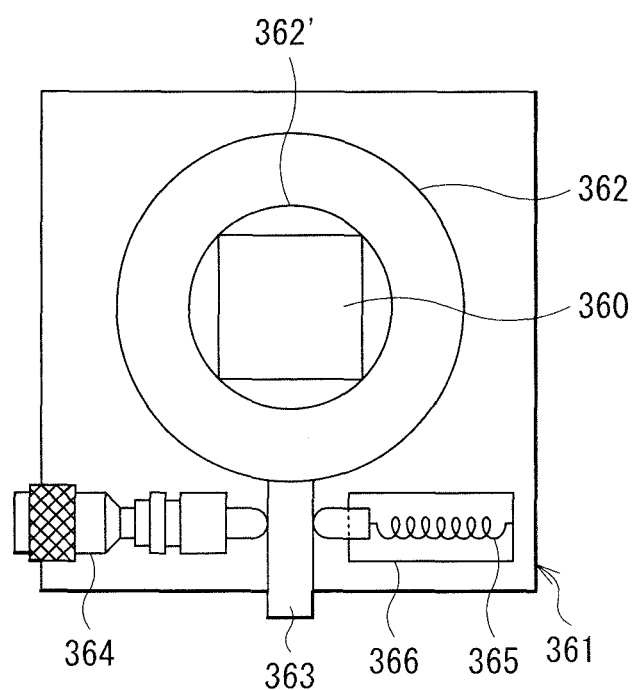
FIG. 19 schematically illustrates a configuration example of the image rotator using the dove prism.

FIGS. 18 and 19 illustrate a configuration example of an image rotator using a dove prism 360 as an example of the image rotator R1, R2, ..., and Rk illustrated in FIGS. 7 and 8. FIG. 18 illustrates a state viewed from a direction of a side surface of the dove prism 360, and FIG. 19 illustrates a state viewed from a direction of a front surface of the dove prism 360.

In FIGS. 18 and 19, a configuration example of an image rotator including components for rotating the dove prism 360. The dove prism 360 may be supported and fixed to the inside of a hole 362' by a rotation stage 362. The rotation stage 362 may be disposed on a fixed stage 361. The rotation stage 362 may be integrally provided with a member 363. The member 363 of the rotation stage 362 may be disposed between a micrometer 364 and a support member 366 containing a spring 365. The micrometer 364 may therefore rotate the rotation stage 362 via the member 363. Rotating the dove prism 360 integrally with the rotation stage 362 may align a rotation direction of light to enter. A material of the dove prism 360 may be a material, such as ZnSe, that allows $CO_2$ laser light to pass therethrough.

Figure 20:
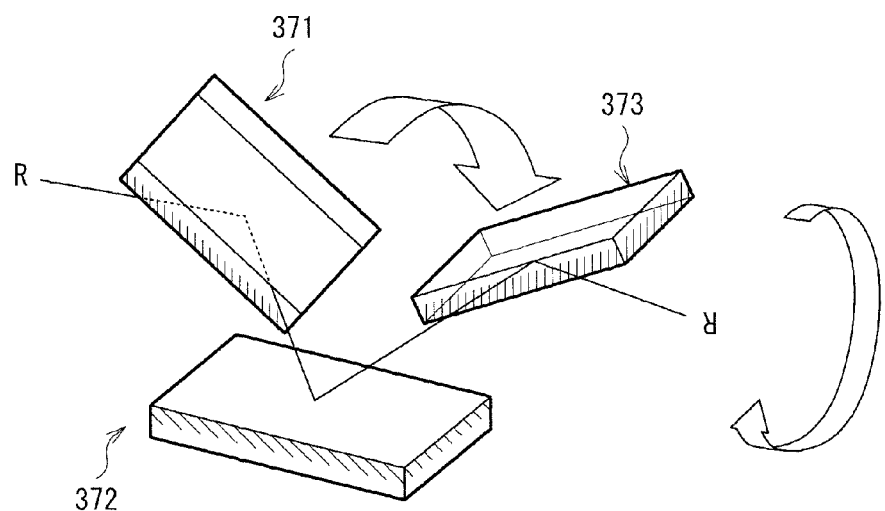
FIG. 20 schematically illustrates a first configuration example of an image rotator using three reflection mirrors.

10.2 First Configuration Example of Image Rotator Using Three Reflection Mirrors FIG. 20 illustrates a configuration example of an image rotator using three reflection mirrors 371, 372, and 373 as another example of the image rotators R1, R2, ..., and Rk illustrated in FIGS. 7 and 8. In a case where the power of a $CO_2$ laser is high, use of a transmission device such as the dove prism 360 illustrated in FIGS. 18 and 19 may cause a temperature distribution in the dove prism 360 by absorption of laser light. This may cause a refractive index distribution to lead to transmitted wavefront distortion. For this reason, three reflection mirrors 371, 372, and 373 may be so provided as to reflect entered light in a similar optical path to an optical path of the dove prism 360. Unillustrated cooling water may flow through substrates of the three reflection mirrors 371, 372, and 373. This may suppress wavefront distortion of the reflected light.

Figure 21:
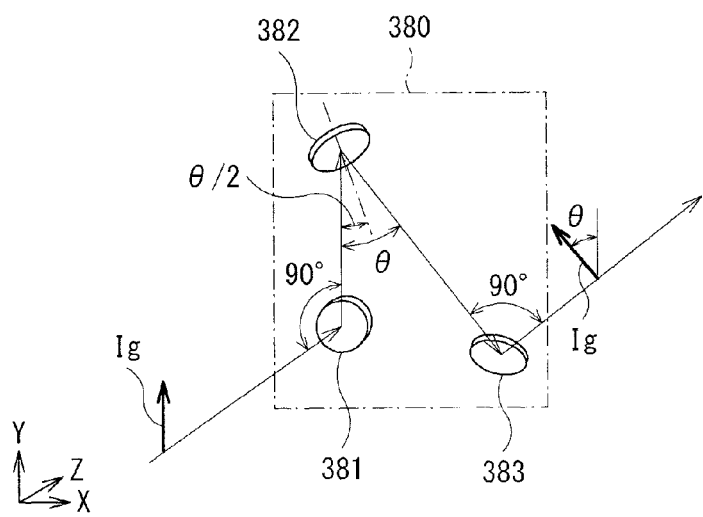
FIG. 21 schematically illustrates a second configuration example of an image rotator using three reflection mirrors.

10.3 Second Configuration Example of Image Rotator Using Three Reflection Mirrors FIG. 21 illustrates a configuration example of an image rotator 380 using three reflection mirrors 381, 382, and 383 as still another example of the image rotators R1, R2, ..., and Rk illustrated in FIGS. 7 and 8. FIG. 21 illustrates a state in which the image rotator 380 rotates a certain light component Ig by a rotation angle θ. The reflection mirror 381 may be so disposed as to reflect entered light toward the reflection mirror 382 at an angle of 90°. The reflection mirror 382 may be so disposed as to reflect the entered light toward the reflection mirror 383 at the angle θ. The reflection mirror 383 may be so disposed as to reflect the entered light at an angle of 90°. Setting an entry angle of light with the reflection mirror 382 to θ/2 may allow the rotation angle by the image rotator 380 to be θ.

[11. Others]

The foregoing description is intended to be merely illustrative rather than limiting. It should therefore be appreciated that variations may be made in example embodiments of the disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. A laser unit, comprising:
   a master oscillator configured to output a linear-polarized laser light beam;
   a first polarization device disposed in a light path of the linear-polarized laser light beam from the master oscillator and provided with a polarization axis that is substantially aligned with a polarization direction of the linearly-polarized incident laser light beam;
   a second polarization device disposed in the light path of the linear-polarized laser light beam and provided with a polarization axis that is substantially aligned with a direction of the polarization axis of the first polarization device; and
   a laser amplifier disposed between the first polarization device and the second polarization device in the light path of the linear-polarized laser light beam and including a pair of discharge electrodes disposed to oppose each other, an opposing direction of the pair of discharge electrodes being substantially aligned with the direction of the polarization axis of the first polarization device.

2. An extreme ultraviolet light generating system, comprising:
   a plasma chamber in which extreme ultraviolet light is to be generated; and
   the laser unit according to claim 1 configured to supply a pulsed laser light beam into the plasma chamber,
   wherein the linear-polarized laser light beam from the master oscillator serves as a seed of the pulsed laser light beam.

3. The laser unit according to claim 1, wherein the linear-polarized laser light beam enters the laser amplifier with the polarization direction of the linear-polarized laser light beam being substantially aligned with the opposing direction of the pair of discharge electrodes.

4. The laser unit according to claim 1, wherein the first polarization device and the second polarization device each comprise a transmission polarizer.

5. The laser unit according to claim 1, wherein
   the first polarization device and the second polarization device each comprise a transmission polarizer, and
   the linear-polarized laser light beam enters the laser amplifier with the polarization direction of the linear-polarized laser light beam being substantially aligned with the opposing direction of the pair of discharge electrodes.

6. The laser unit according to claim 1, wherein the discharge electrodes are made of copper.

7. The laser unit according to claim 1, wherein the discharge electrodes are made of aluminum.

* * * * *